US010818635B2

(12) United States Patent
Olson et al.

(10) Patent No.: US 10,818,635 B2
(45) Date of Patent: Oct. 27, 2020

(54) FULLY MOLDED SEMICONDUCTOR PACKAGE FOR POWER DEVICES AND METHOD OF MAKING THE SAME (71) Applicant: Deca Technologies Inc., Tempe, AZ (US)

(72) Inventors: Timothy L. Olson, Phoenix, AZ (US); Christopher M. Scanlan, Chandler, AZ (US)

(73) Assignee: DECA TECHNOLOGIES INC., Tempe, AZ (US)

( * ) Notice: Subject to any disclaimer, the term of this patent is extended or adjusted under 35 U.S.C. 154(b) by 0 days.

(21) Appl. No.: 16/390,950

(22) Filed: Apr. 22, 2019

(65) Prior Publication Data

US 2019/0326255 A1 Oct. 24, 2019

Related U.S. Application Data (60) Provisional application No. 62/661,535, filed on Apr. 23, 2018.

(51) Int. Cl.
*H01L 23/00* (2006.01)
*H01L 21/56* (2006.01)
(Continued)

(52) U.S. Cl.
CPC ............ *H01L 24/96* (2013.01); *H01L 21/486* (2013.01); *H01L 21/561* (2013.01);
(Continued)

(58) Field of Classification Search
CPC ....... H01L 24/96; H01L 21/78; H01L 21/568; H01L 24/94; H01L 24/19; H01L 21/486;
(Continued)

(56) References Cited

U.S. PATENT DOCUMENTS 6,306,680 B1 * 10/2001 Fillion ................ H01L 23/3121
257/E21.508
2008/0191359 A1 * 8/2008 Koller ................. H01L 23/3114
257/773
(Continued)

FOREIGN PATENT DOCUMENTS

| EP | 2738813 | 6/2014 |
| WO | 2015042244 | 3/2015 |

*Primary Examiner* — Bitew A Dinke
(74) *Attorney, Agent, or Firm* — Booth Udall Fuller, PLC (57) ABSTRACT A method of making a semiconductor device can include providing a semiconductor die comprising a front surface comprising a gate pad and a source pad, the semiconductor die further comprising a back surface opposite the front surface, the back surface comprising a drain. A gate stud may be formed over and coupled to the gate pad. A source stud may be formed over and coupled to the source pad. An encapsulant may be formed over the semiconductor die. A through mold interconnect may extend between opposing first and second surfaces of the encapsulant. An RDL may be coupled to the gate stud, the source stud, and to the through mold interconnect. A land pad may be formed over the back surface of the semiconductor die and be coupled to the drain after singulating the semiconductor die from its native wafer and after forming the encapsulant over the semiconductor die.

19 Claims, 7 Drawing Sheets (51) Int. Cl.
*H01L 21/48* (2006.01)
*H01L 21/683* (2006.01)
*H01L 21/78* (2006.01)

(52) U.S. Cl.
CPC ........ *H01L 21/568* (2013.01); *H01L 21/6835* (2013.01); *H01L 21/78* (2013.01); *H01L 24/05* (2013.01); *H01L 24/19* (2013.01); *H01L 24/94* (2013.01); *H01L 2221/68359* (2013.01); *H01L 2221/68372* (2013.01); *H01L 2224/95001* (2013.01)

(58) Field of Classification Search
CPC ... H01L 21/561; H01L 24/05; H01L 21/6835; H01L 2221/68359; H01L 2224/95001; H01L 2221/68372; H01L 23/3114; H01L 23/49805; H01L 24/93–97
See application file for complete search history.

(56) References Cited

U.S. PATENT DOCUMENTS

| | | | |
|---|---|---|---|
| 2009/0181495 A1* | 7/2009 | Otremba | H01L 21/561 438/107 |
| 2009/0227071 A1* | 9/2009 | Otremba | H01L 23/5389 438/113 |
| 2009/0230535 A1* | 9/2009 | Otremba | H01L 21/561 257/690 |
| 2009/0236749 A1* | 9/2009 | Otremba | H01L 23/36 257/774 |
| 2010/0013106 A1* | 1/2010 | Otremba | H01L 21/561 257/777 |
| 2010/0019381 A1* | 1/2010 | Haeberlen | H01L 21/561 257/737 |
| 2010/0044885 A1* | 2/2010 | Fuergut | H01L 21/561 257/784 |
| 2010/0078783 A1* | 4/2010 | Otremba | H01L 23/5389 257/676 |
| 2010/0157568 A1* | 6/2010 | Ewe | H01L 21/561 361/820 |
| 2011/0001245 A1* | 1/2011 | Jobetto | H01L 21/486 257/773 |
| 2011/0045634 A1* | 2/2011 | Pagaila | H01L 24/19 438/107 |
| 2011/0108971 A1* | 5/2011 | Ewe | H01L 21/56 257/686 |
| 2011/0127675 A1* | 6/2011 | Ewe | H01L 23/5389 257/773 |
| 2011/0140254 A1* | 6/2011 | Tsai | H01L 23/495 257/676 |
| 2013/0105970 A1* | 5/2013 | Chi | H01L 21/561 257/737 |
| 2013/0146991 A1* | 6/2013 | Otremba | H01L 25/071 257/401 |
| 2013/0241040 A1* | 9/2013 | Tojo | H01L 23/051 257/666 |
| 2013/0280826 A1* | 10/2013 | Scanlan | H01L 23/544 438/15 |
| 2013/0292684 A1* | 11/2013 | Nikitin | H01L 24/03 257/76 |
| 2013/0328213 A1* | 12/2013 | Otremba | H01L 23/36 257/774 |
| 2014/0035154 A1* | 2/2014 | Geitner | H01L 23/66 257/774 |
| 2014/0264950 A1* | 9/2014 | Steiner | H01L 23/49513 257/783 |
| 2015/0187710 A1* | 7/2015 | Scanlan | H01L 24/05 257/777 |
| 2016/0300779 A1* | 10/2016 | Watanabe | H01L 24/19 |
| 2016/0308015 A1 | 10/2016 | Shea et al. | |
| 2017/0077022 A1* | 3/2017 | Scanlan | H01L 23/49838 |
| 2017/0117260 A1 | 4/2017 | Prabhu et al. | |
| 2017/0271298 A1* | 9/2017 | Heinrich | H01L 23/5385 |
| 2018/0331005 A1* | 11/2018 | Fukuchi | H01L 23/482 |

\* cited by examiner

FULLY MOLDED SEMICONDUCTOR PACKAGE FOR POWER DEVICES AND METHOD OF MAKING THE SAME

CROSS REFERENCE TO RELATED APPLICATIONS

This application claims the benefit of U.S. Provisional Patent No. 62/661,535, entitled "Fully Molded Semiconductor Package for Power Devices," which was filed on Apr. 23, 2018, the disclosure of which is hereby incorporated by reference in its entirety.

TECHNICAL FIELD

The disclosure relates in general to semiconductor devices and, more particularly, to fully molded semiconductor packages, and more particularly to fully molded semiconductor packages for power devices (FMSP-PD).

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density, active and passive components. Back-end processes may result in semiconductor device packages with a smaller footprint by improvements in electrical interconnection and packaging materials.

SUMMARY

This disclosure relates to fully molded semiconductor packages, and more particularly to fully molded semiconductor packages for power devices (FMSP-PD). Accordingly, in an aspect, a method of making a semiconductor package can comprise providing a semiconductor die comprising a front surface comprising a gate pad and a source pad, the semiconductor die further comprising a back surface opposite the front surface, the back surface comprising a drain. A gate stud may be formed over and coupled to the gate pad. A source stud may be formed over and coupled to the source pad. An encapsulant may be formed over the semiconductor die and comprising a first surface over the front surface of the semiconductor die and a second surface opposite the first surface. A through mold interconnect may extend between the first surface of the encapsulant and the second surface of the encapsulant. An RDL may be coupled to the gate stud, the source stud, and to the through mold interconnect. A land pad may be formed over the back surface of the semiconductor die and be coupled to the drain after singulating the semiconductor die from its native wafer and after forming the encapsulant over the semiconductor die.

The method of making the semiconductor device can further comprise forming the encapsulant around the semiconductor die and contacting a side surface of the gate stud and contacting a side surface of the source stud. The land pad may be formed with an area greater than an area of the semiconductor die. The source stud may be formed with an area greater than or equal to 50% of an area of the semiconductor die. A barrier layer may be formed over the drain and extend beyond a footprint of the semiconductor die. The barrier layer may contact 80% or more of the back surface of the semiconductor die. The land pad may be formed over the barrier layer after forming the barrier layer. The source stud may be formed with an area greater than or equal to 50% of an area of the semiconductor die. The gate stud may be formed over and coupled to the gate pad before singulating the semiconductor die from its native wafer. The source stud may be formed over and coupled to the source pad before singulating the semiconductor die from its native wafer.

In another aspect, a method of making a semiconductor package can comprise providing a semiconductor die comprising a front surface comprising a source pad, the semiconductor de further comprising a back surface opposite the front surface, the back surface comprising a drain. A source stud may be formed over and coupled to the source pad. An encapsulant may be formed over the semiconductor die and comprising a first surface over the front surface of the semiconductor die and a second surface opposite the first surface. A through mold interconnect may be formed that extends between the first surface of the encapsulant and the second surface of the encapsulant. A land pad may be formed over the back surface of the semiconductor die and coupled to the drain after singulating the semiconductor die from its native wafer, the land pad extending beyond a footprint of the semiconductor die.

The method of making the semiconductor device can further comprise forming the land pad with an area greater than an area of the semiconductor die. The encapsulant may be formed around the semiconductor die and contacting a side surface of the gate stud and contacting a side surface of the source stud. The source stud may be formed with an area greater than or equal to 50% of an area of the semiconductor die. A barrier layer may be formed over the drain and extending beyond a footprint of the semiconductor die, the barrier layer contacting 80% or more of the back surface of the semiconductor die. The land pad may be formed over the barrier layer after forming the barrier layer. The source stud may be formed with an area greater than or equal to 50% of an area of the semiconductor die. A gate stud may be formed over and coupled to the gate pad before singulating the semiconductor die from its native wafer. The source stud may be formed over and coupled to the source pad before singulating the semiconductor die from its native wafer.

In another aspect, a method of making a semiconductor package can comprise providing a semiconductor die comprising a front surface comprising a source pad, the semiconductor de further comprising a back surface opposite the front surface, the back surface comprising a drain. An encapsulant may be formed over the semiconductor die and comprise a first surface over the front surface of the semiconductor die and a second surface opposite the first surface. A through mold interconnect may be formed and extend between the first surface of the encapsulant and the second surface of the encapsulant. A land pad may be formed over the back surface of the semiconductor die and may be coupled to the drain after forming the encapsulant over the semiconductor die.

The semiconductor package can further comprise forming the land pad extending beyond a footprint of the semiconductor die. A source stud may be formed over and coupled to the source pad. The encapsulant may be formed around the semiconductor die and contact a side surface of the source stud. The source stud may be formed with an area greater than or equal to 50% of an area of the semiconductor die. A barrier layer may be formed over the drain and extend beyond a footprint of the semiconductor die, the barrier layer contacting 80% or more of the back surface of the semiconductor die. The land pad may be formed over the barrier layer after forming the barrier layer. A gate stud may be formed over and coupled to the gate pad before singulating the semiconductor die from its native wafer. A source stud may be formed over and coupled to the source pad before singulating the semiconductor die from its native wafer.

The foregoing and other aspects, features, and advantages will be apparent to those artisans of ordinary skill in the art from the DESCRIPTION and DRAWINGS, and from the CLAIMS.

DETAILED DESCRIPTION

The present disclosure includes one or more embodiments in the following description with reference to the figures, in which like numerals represent the same or similar elements. It will be appreciated by those skilled in the art that the description is intended to cover alternatives, modifications, and equivalents as may be included within the spirit and scope of the disclosure as defined by the appended claims and their equivalents as supported by the following disclosure and drawings.

In the following description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGS. are illustrative representations and are not necessarily drawn to scale.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

The terms "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography. Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the layer to be patterned such as surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. Alternatively, some types of materials are patterned by directly depositing material into the areas or voids formed by the photoresist or by a previous deposition/etch process using techniques such as electroless and electrolytic plating. The chemistry of photoresists is such that the photoresist remains substantially intact and resists removal by chemical etching solutions or plating chemistries while the portion of the top layers of the semiconductor wafer not covered by the photoresist is removed or is added to by plating. The process of forming, exposing, and removing the photoresist, as well as the process of removing a portion of the semiconductor wafer or adding to a portion of the wafer can be modified according to the particular resist used and the desired results.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers (RDLs), or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 1A:
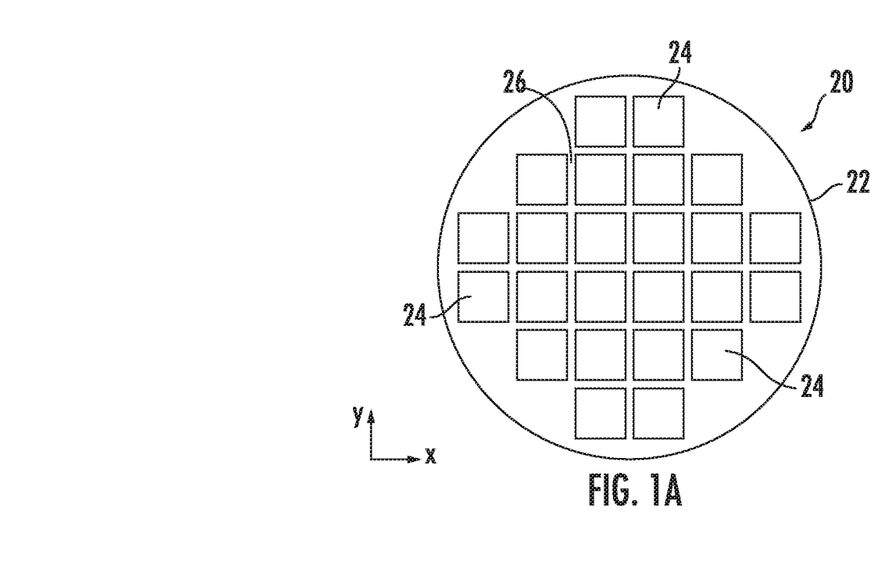
FIGS. 1A-1D illustrate a plurality of semiconductor die comprising studs for use in FMSP-PDs.

FIG. 1A shows a plan view of a semiconductor wafer 20 with a base substrate material 22, such as, without limitation, silicon, germanium, gallium arsenide, indium phosphide, or silicon carbide, for structural support. A plurality of semiconductor die or components 24 is formed on wafer 20 separated by a non-active, inter-die wafer area or saw street 26 as described above. Saw street 26 provides cutting areas to singulate semiconductor wafer 20 into individual semiconductor die 24. The semiconductor die 24 comprise power devices or other back-side contact devices, such as metal-oxide-semiconductor field-effect transistor (MOSFETs), MOSFET semiconductor die, insulated-gate bipolar transistors (IGBTs), and power diodes, hereinafter collectively referred to as power devices or (PDs).

Figure 1B:
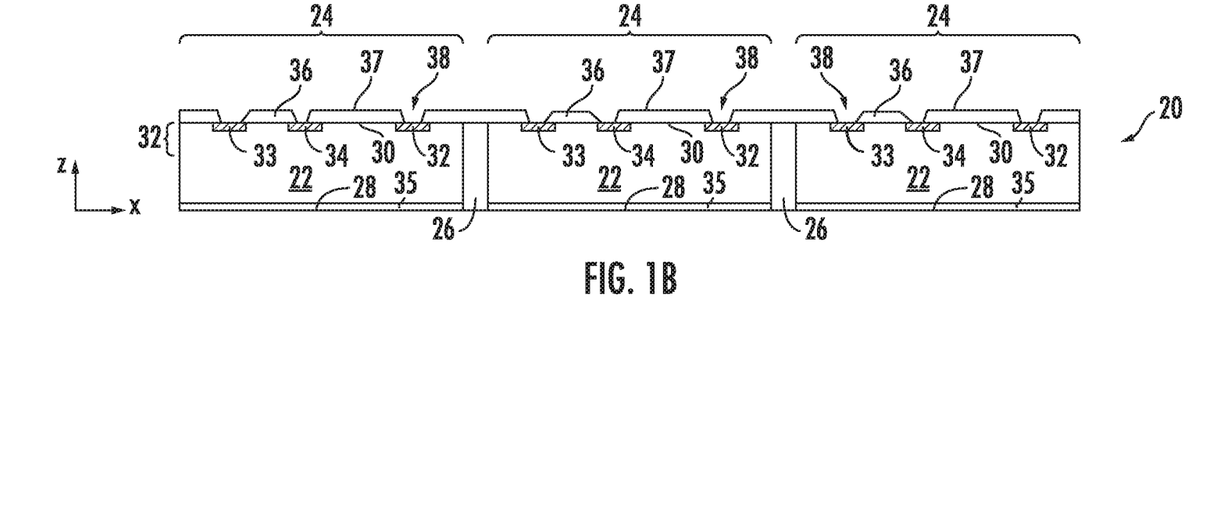

FIG. 1B shows a cross-sectional view of a portion of semiconductor wafer 20 shown previously in the plan view of FIG. 1A. Each semiconductor die 24 has a backside or back surface 28 and active surface 30 opposite the backside. Active surface 30 contains analog or digital circuits implemented as active devices, passive devices, conductive layers, and dielectric layers formed within the die and electrically interconnected according to the electrical design and function of the semiconductor die. For example, the circuit may include one or more transistors, diodes, and other circuit elements formed within active surface 30 to implement analog circuits or digital circuits, such as DSP, ASIC, memory, or other signal processing circuit. Semiconductor die 24 may also contain integrated passive devices (IPDs), such as inductors, capacitors, and resistors, for RF signal processing.

An electrically conductive layer 32 is formed over active surface 30 using PVD, CVD, electrolytic plating, electroless plating process, or other suitable metal deposition process. Conductive layer 32 can be one or more layers of aluminum (Al), copper (Cu), tin (Sn), nickel (Ni), gold (Au), silver (Ag), or other suitable electrically conductive material. Conductive layer 32 operates as contact pads or bond pads electrically connected to the circuits on active surface 30. Conductive layer 32 can be formed as contact pads disposed side-by-side a first distance from the edge of semiconductor die 24, as shown in FIG. 1B. Alternatively, conductive layer 32 can be formed as contact pads that are offset in multiple rows or in an array across an entire surface area of semiconductor die 24. The full array of contact pads can be formed in a regular or irregular pattern across the entire surface of semiconductor die 24 according to the configuration and design of the semiconductor die.

The semiconductor die 24 may comprise PDs in which portions of the conductive layer 32 are more specifically formed with one or more gate pads 33 and one or more source or emitter pads 34 formed on an active surface of the semiconductor die 24. The semiconductor die 24 may further comprises a backside or back surface 28, opposite the front side or active surface of the semiconductor die 24. The backside 28 of the semiconductor die 24 may comprise one or more drains or collectors 35.

FIG. 1B also shows an optional insulating or passivation layer 36 formed over active surface 30 of semiconductor die 24 while the semiconductor die 24 are part of the native semiconductor wafer 20 comprising a plurality of semiconductor die 24. Insulating layer 36 can be conformally applied to, and have a bottom or first surface that follows the contours of, semiconductor die 24. Insulating layer 36 has a top or second planar surface 37 opposite the first surface. Insulating layer 36 can be an organic or inorganic layer and contain one or more layers of photosensitive low curing temperature dielectric resist, photosensitive composite resist, laminate compound film, solder mask resist film, liquid molding compound, a polymer layer, silicon dioxide (SiO2), silicon nitride (Si3N4), silicon oxynitride (SiON), aluminum oxide (Al2O3), polyimide, or other material having similar insulating and structural properties. Insulating layer 36 can be deposited using printing, spin coating, spray coating, lamination, or other suitable process. A portion of insulating layer 36 can be removed by laser ablation, etching, or other suitable process to expose conductive layer 32 of semiconductor die 24 according to the configuration and design of the semiconductor die, including gate pad(s) 33 and the source pad(s) 34. Insulating layer 36 can be patterned to form openings 38 that extend completely through insulating layer 36, after which insulating layer 36 can also be optionally cured.

Figure 1C:
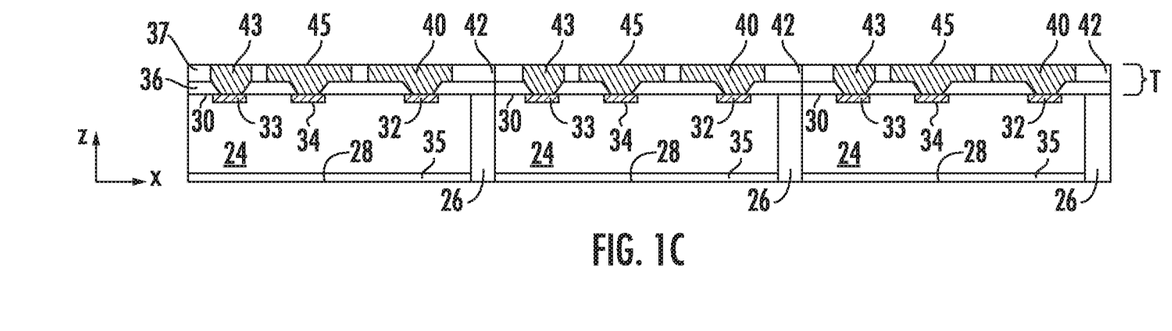
Figure 1D:
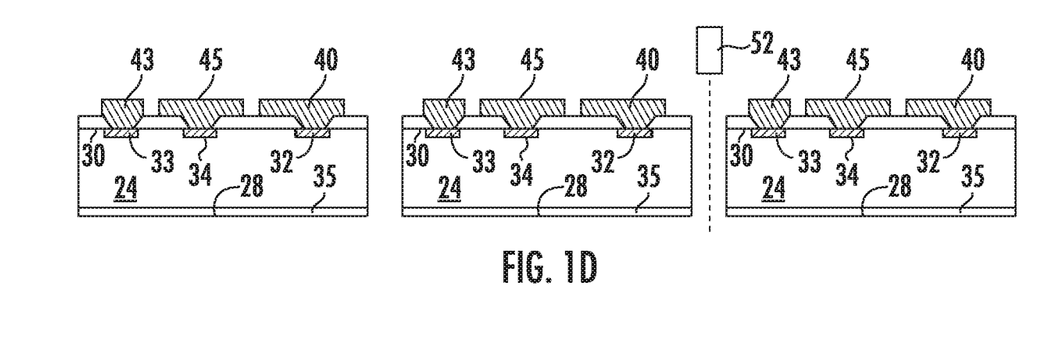

FIG. 1C shows studs or an electrically conductive layer 40 that can be formed using a patterning and metal deposition process such as sputtering, electrolytic plating, and electroless plating. Studs 40 can be one or more layers of Al, Cu, Sn, Ni, Au, Ag, or other suitable electrically conductive material, including seed, barrier, and adhesion layers. Studs 40 can be electrically connected to contact pads 32. More specifically the studs or conductive layer 40 may comprise one or more of a gate stud 43 and a source stud 45. A thickness T of the conductive layer or studs 40 can be in a range of 20-100 micrometers (μm), 20-80 μm, 20-50 μm, greater than or equal to 20 micrometers (μm), and can be greater than or equal to 50 μm. The formation of studs 43 and studs 45 may be at the native wafer level before the semiconductor wafer 20 undergoes dicing or singulation to separate the individual semiconductor die 24, as shown in FIG. 1D.

The gate stud 43 may be formed over the gate pad 33 to provide electrical interconnect and offset from the active surface of the semiconductor die 24, and as noted above, in some instances will be a Cu stud or plated Cu stud. Some vertical power semiconductor devices or semiconductor die 24, such as power diodes, do not comprise a gate pad 33, and therefore do not require an associated gate stud 43.

The source stud 45 may be formed over the source pad 34 to provide electrical interconnect and offset from the active surface of the semiconductor die 24, and as noted above, in some instances will be a Cu stud or plated Cu stud. The source stud 45 can comprise (or be) a large area interconnect to the source pad 34 for low "drain-source on resistance" (Rdson/RDS(on)) or for a low total resistance between the drain 35 and source 34 in the semiconductor die 24, such as for a MOSFET when the MOSFET is on. The source stud 45 may comprise an area that is thick, large, or both thick and large (with respect to the total area or footprint of the semiconductor die 24) and connects to the source pad 34 on the die 24. The source stud 45 may comprise a size or area greater than 50% of the die area or the area of the footprint (as seen in the x-y plane) of the semiconductor die 24. The thickness T of the source stud 45, as indicated above, can be at least 20 micrometers (μm), and can be greater than or equal to 50 μm. In some instances, the source stud 45 may comprise a size or area that is greater than 20 times a size or area of the size, footprint, or form-factor of the gate stud 43. In some instances, as shown e.g. in the enlarged view of FIG. 3B, the insulating layer 36 may comprise multiple openings formed over a single source pad 34 or multiple source pads 34.

FIG. 1C shows an embodiment in which studs 40 can be formed by first depositing and patterning a temporary insulating or passivation layer 42. Insulating layer 42 can be conformally applied to, and have a first surface that follows the contours of, semiconductor die 24, insulating layer 36, or both. Insulating layer 42 can have a second planar surface opposite the first surface. Insulating layer 42 can be an organic or inorganic layer and contain one or more layers of photosensitive low curing temperature dielectric resist, photosensitive composite resist, laminate compound film, solder mask resist film, liquid molding compound, polymer, SiO2, Si3N4, SiON, Al2O3, polyimide, or other material having similar insulating and structural properties. Insulating layer 42 can be deposited using printing, spin coating, spray coating, lamination, or other suitable process. Insulating layer 42 can be patterned to form openings completely through the insulating layer 42 and through insulating layer 36, if present, to expose contact pads 32, including gate pad 33 and source pad 34.

Insulating layer 36 can also be optionally cured, and can form part of a permanent structure of the final semiconductor package. Alternatively, insulating layer 36 can be a temporary layer, such as a photoresist layer, that is subsequently removed and does not form part of the final structure of the semiconductor die. Insulating layer 42 can be deposited over insulating layer 36, or when optional insulating layer 36 is omitted, over and in contact with semiconductor die 24. A portion of insulating layer 42 can be removed by laser, or when a photoresist layer, can be exposed and removed by an etching development process. Studs 40 can then be formed in the removed portion of insulating layer 42 and in openings 38, if present. Openings 38 and the openings in insulating layer 42 can be formed at a same time or at different times. An entirety of studs 40 can be formed at a same time, or portions of the conductive layer can be formed at different times. Insulating layer 42 can be removed after the formation of studs 40 is complete.

In FIG. 1C or FIG. 1D, semiconductor wafer 20 may undergo an optional grinding operation with grinder to planarize the surface of backside 28 and to reduce a thickness of the semiconductor wafer 20. A chemical etch or other suitable process may also be used to remove and planarize semiconductor wafer 20. The native wafer 20 may be thinned to an interim thickness in a range of 400-600 µm, or about 500 um, wherein about means less than or equal to a percent difference of 10%, 5%, 3%, or 1%.

FIG. 1D shows the native semiconductor wafer 20 comprising a plurality of semiconductor die 24 may then be singulated or diced to create discrete, individual chips or semiconductor die 24. The semiconductor wafer 20 can be singulated through saw streets 26 using a saw blade or laser cutting tool 52 into individual semiconductor die 24.

Figure 2A:
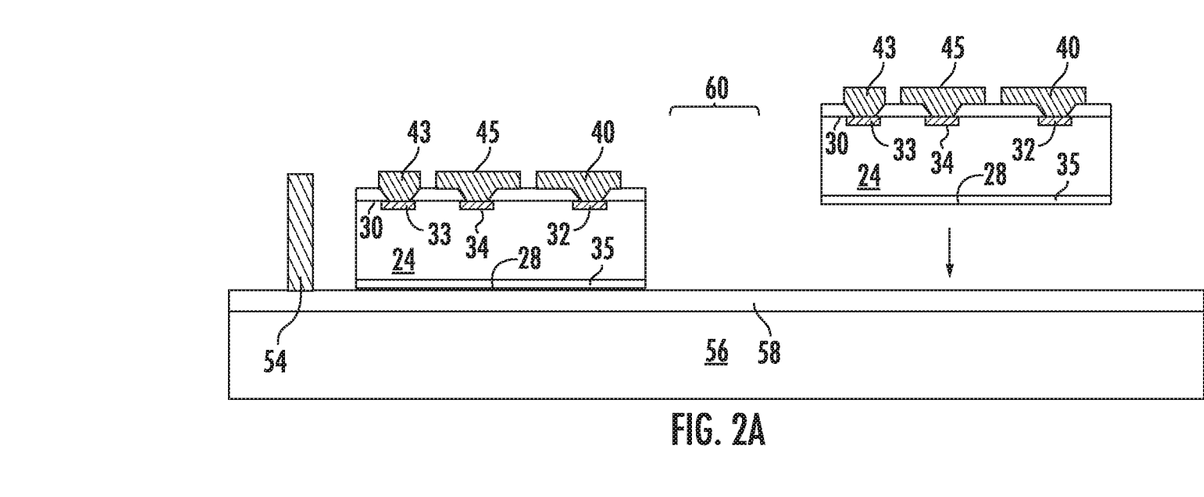
FIGS. 2A-2F illustrate views of a method of forming FMSP-PDs.

FIG. 2A shows a temporary carrier or substrate 56 containing temporary or sacrificial base material such as silicon, polymer, stainless steel, or other suitable low-cost, rigid material for structural support. An optional interface layer or double-sided tape 58 may be formed over carrier 56 as a temporary adhesive bonding film or etch-stop layer. In an embodiment, carrier 56 can be a ring-shaped film frame comprising an open center portion that supports tape 58 at a periphery of the tape. Alternatively, carrier 56 may be a flat plate without an open center area that supports tape 58 across an upper surface of carrier 56. A number of fiducial alignment marks can be positioned over or attached to substrate 56 or interface layer 58 for use in properly positioning semiconductor die 24 on carrier 56. Alternatively a portion of substrate 56 or an interface layer 58 can removed or marked to form the fiducial.

FIG. 2A further shows semiconductor die 24 from FIG. 1E mounted face up to carrier 56 and interface layer 58 with backside 28 oriented towards the substrate. The semiconductor die 24 are mounted with the active surface 30, as well as the gate studs 43 and source studs 45, oriented away from the carrier. Semiconductor die 24 may be placed over carrier 56 using a pick and place operation or other suitable operation. Semiconductor die 24 may be positioned with respect to a fiducial according to a nominal or predetermined position and spacing for the semiconductor die 24. Semiconductor die 24 are mounted to carrier 56 such that the semiconductor die are separated by a space or gap 60 when mounted over carrier 56 that can provide an area for a subsequently formed interconnect structure, such as a fan-out interconnect structure, as part of a final semiconductor package together with an area for subsequently singulating the fully formed FMSP-PD 140. A size of gap 60 may include sufficient area for optionally mounting semiconductor devices or components, including through mold interconnects 54, within the subsequently formed semiconductor packages.

FIG. 2A also shows that through mold interconnects 54, which provide vertical through package electrical interconnect from the backside 28 to the active surface 30, may be formed around and in a periphery of the semiconductor die 24 before the encapsulant 62 is disposed around the semiconductor die 24 and the through mold interconnects 54. Molding or placement of the encapsulant 62 is discussed in greater detail below with respect to FIG. 2B. However, in some instances, the through mold interconnects 54 can be place as preformed vertical interconnect components on the temporary carrier 56 before the encapsulant 62 is disposed over the carrier 56 and semiconductor die 24. As shown on the left side of FIG. 2A, the through mold interconnect 54 may be placed on the temporary carrier 56 next to, or in a periphery of, each semiconductor die 24. In some instances, the through mold interconnects 54 may be coupled together by a connecting portion or frame that helps to preserve relative position and spacing among the through mold interconnects 54, the connecting portion or frame being subsequently removed, such as in a grinding process.

Figure 2B:
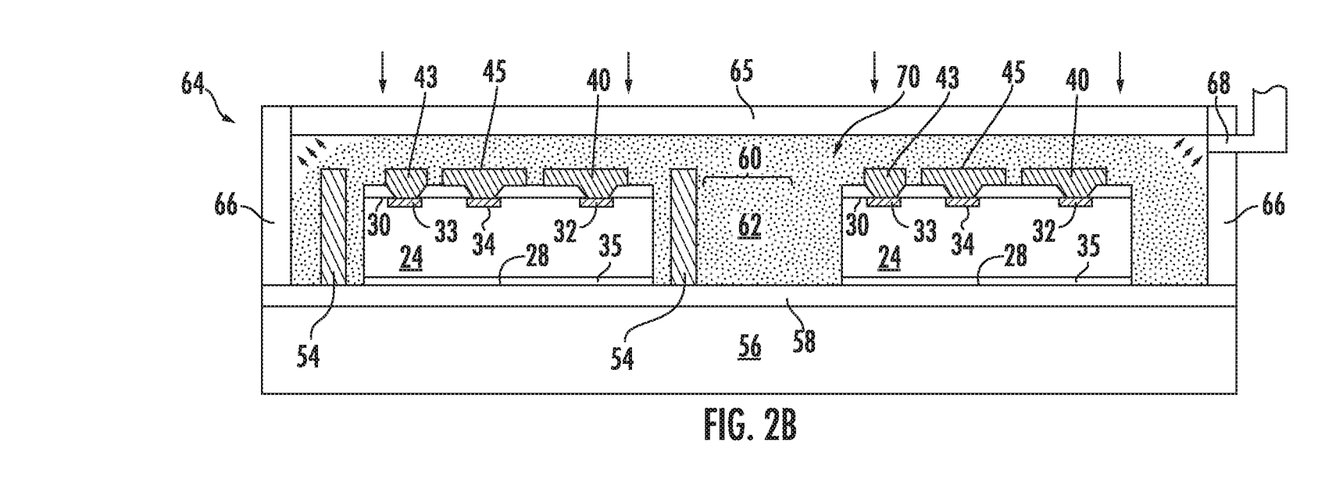

FIG. 2B shows an encapsulant 62 is deposited using a paste printing, compression molding, transfer molding, liquid encapsulant molding, lamination, sheet molding, vacuum lamination, vacuum printing, spin coating, or other suitable applicator or process. Specifically, FIG. 2B shows a mold 64 with a plurality of sidewalls 66 brought together with top portion or plate 65, carrier 56, and interface layer 58 to enclose semiconductor die 24 within the mold for subsequent encapsulation. Mold 64 can also include a bottom portion on which carrier 56 is placed and to which sidewalls 66 can be in contact. In an embodiment, carrier 56 and interface layer 58 can serve as the bottom mold portion for the subsequent encapsulation process. Alternatively, semiconductor die 24, carrier 56, and interface layer 58 can be disposed within a mold including multiple portions, such as top and bottom portions. Mold 64 is brought together by moving mold 64 around semiconductor die 24, or alternatively, by moving the semiconductor die into the mold.

FIG. 2B further shows mold 64 encloses semiconductor die 24 with a cavity or open space 70. Cavity 70 extends within mold 64 to semiconductor die 24 and interface layer 58. A volume of encapsulant 62 is disposed over semiconductor die 24 and carrier 56. Inlet 68 can be an exhaust port that does not provide an escape path for encapsulant 62. Encapsulant 62 can be a polymer composite material, such as epoxy resin with filler, epoxy acrylate with filler, or polymer with proper filler. The volume of encapsulant 62 is measured according to the space requirements of cavity 70 less the area occupied by semiconductor die 24 and any additional semiconductor devices that might be present. Encapsulant 62 is disposed over and around semiconductor die 24, including side surface of the semiconductor die 24, as well as the studs 40, including gate stud 43 and source stud 45. The encapsulation or molding may be performed with a single encapsulant 62 in a single step. As such, encapsulant 62 can contact sidewalls of the studs 40 so that a single encapsulant 62 can be in direct contact with, and extend along sides of, semiconductor die 24 and studs 40 to be disposed over the side surfaces and over the active surface 30 of the semiconductor die 24.

Top portion 65 of mold 64 can move along sidewalls 66 toward encapsulant 62 and semiconductor die 24 until the top portion contacts the encapsulant to evenly disperse and uniformly distribute encapsulant 62 within cavity 70 around semiconductor die 24. A viscosity and elevated temperature of encapsulant 62 can be selected for uniform coverage, for example, a lower viscosity and elevated temperature can increase the flow of the encapsulant for molding, paste printing, and spin coating. The temperature of encapsulant 62 can also be controlled within cavity 70 to promote curing of the encapsulant. Semiconductor die 24 are embedded together in encapsulant 62, which is non-conductive and environmentally protects the semiconductor device from external elements and contaminants.

When vacuum compression molding is used, a sacrificial release film can be disposed between top portion 65 and sidewalls 66 of cavity 70 and encapsulant 62 within the cavity to prevent the encapsulant from sticking, or attaching, to the top portion and sidewalls of the cavity. When other types of molding are used, such as transfer molding, the sacrificial release film can be omitted and encapsulant 62 can contain a mold release agent, or an interior surface of cavity 70 can be treated with a mold release agent to prevent the encapsulant from attaching to the interior surface of the mold.

Figure 2C:
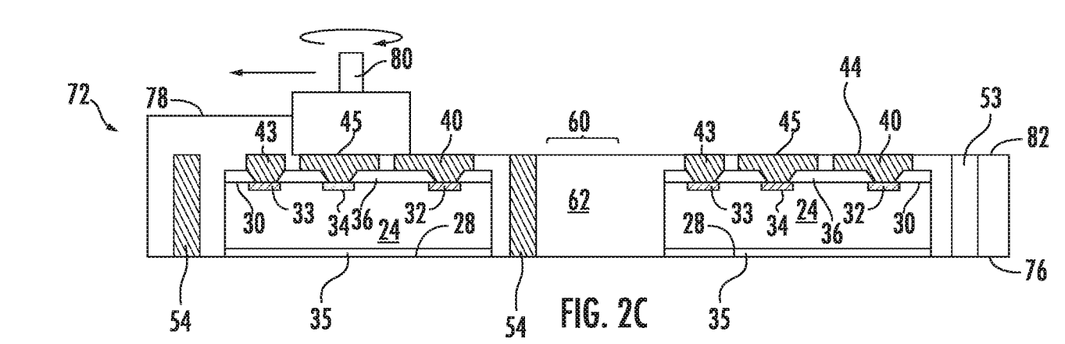

In FIG. 2C, semiconductor die 24 are removed from mold 64 with encapsulant 62 as a panel or embedded die panel 72. Panel 72 can optionally undergo a curing process to cure encapsulant 62. Carrier 56 and interface layer 58 can be removed by chemical etching, mechanical peeling, CMP, mechanical grinding, thermal bake, UV light, laser scanning, wet stripping, or other suitable process to expose a back surface 76 of encapsulant 62 opposite front surface 78 of the encapsulant. In an embodiment, encapsulant 62 is cured, either partially or entirely, before carrier 56, interface layer 58, or both, are removed. Alternatively, encapsulant 62 can be cured, either partially or entirely, after carrier 56, interface layer 58, or both are removed.

The encapsulant 62 can be formed or disposed over all but the back surface 28 of the semiconductor die 24. As such, back surface 76 of panel 72 can be substantially coplanar with back surface 28 of semiconductor die 24. Both back surface 76 and back surface 28 can be exposed by the removal of carrier 56 and interface layer 58. After removal of carrier 56 and interface layer 58, FIG. 2C shows encapsulant 62 disposed around semiconductor die 24 within embedded die panel 72. Panel 72 can include a footprint or form factor of any shape and size that allows for, and facilitates, the subsequent processing required to form semiconductor packages as described in greater detail below. As a non-limiting example, panel 72 can include a form factor similar to the form factor of a 300 millimeter (mm) semiconductor wafer and include a circular footprint having a diameter of 300 mm. Panel 72 can also be of any other desirable size, and can include shapes or formats such as rectangular or square. In an embodiment, panel 72 can be what is known in the art as a reconstituted wafer or reconstituted panel.

While in some instances the through mold interconnect 54 will be disposed adjacent the semiconductor die 24 before the molding process or encapsulant 62 is disposed or formed around the semiconductor die 24, in other instances the through mold interconnect will be formed after the before the molding process or encapsulant 62 is disposed or formed around the semiconductor die 24. For example, the through mold interconnect 54 can also be formed by forming a via 53 through encapsulant 62, such as after removing the panel 72 from the carrier 56, as shown on the right of FIG. 2C. In other instances the vias 53 could be formed before removing the panel 72 from the carrier 56. In some instances, the vias 53 can be blind vias formed by laser ablation of the encapsulant 62 from the back-side 76 of the panel, exposing a portion of the build-up interconnect layer 106, including the RDL layer 110 shown, e.g., in FIG. 2D. A plating process may also be used to fill the vias 53 with copper or another a suitable conductive material. The plating process may include Cu electroplating or electroless plating, and other suitable processes may also be used. Once formed, the through mold interconnects 54 can provide for electrical interconnections between the source pads 34, the gate pads 33, and the backside of the package, by extending completely through the encapsulant 62.

FIG. 2C also shows that panel 72 can undergo a grinding operation with grinder 80 to reduce a thickness of panel 72 to remove surface 78 and to expose a portion of studs 40, such as a surface of gate stud 43 and source stud 45, to expose through mold interconnects 54, when present, and to expose a new front surface 82 of encapsulant 62 or panel 72 that is substantially coplanar with a surface of studs 40, such as a surface of gate stud 43 and source stud 45. A chemical etch can also be used to remove and planarize a portion of encapsulant 62 in panel 72. The grinding or removal process may occur before or after the carrier 56 is removed. The studs 40 coupled to contact pads 32, and mores specifically the gate stud 43 coupled to the gate pad 33 and the source stud 45 coupled to the source pad 34, may be exposed with respect to encapsulant 62 at surface 82 of panel 72 to provide for electrical connection between semiconductor die 24 and points external to the subsequently formed semiconductor package. Because a thickness of encapsulant 62 is reduced to expose studs 40, a thickness of encapsulant 62 over active surface 30 of semiconductor die 24 can also be equal, or substantially equal, to the thickness or height of the studs 40.

After the reconstituted panel 72 is removed from the temporary carrier 56, a temporary polymer layer may optionally be applied on the back-side of the reconstituted panel 72. A top surface or portion of the reconstituted wafer may undergo a grinding process, as described above, to reveal or expose ends of the studs 43, 45 on each die 24 as well as the vertical interconnect components 54.

Figure 2D:
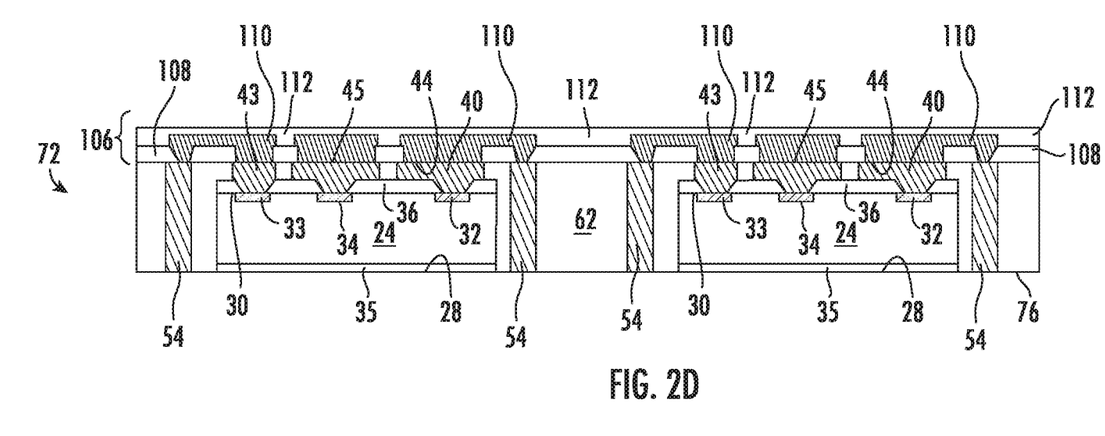

FIG. 2D shows a build-up interconnect structure 106 can be formed over panel 72 after the molding process and forming of encapsulant 62, the build-up interconnect structure 106 providing electrical connection between one or more of the gate pad 33, the source pad 34, and the drain 35 at the backside 28 of the semiconductor die 24 through the through mold interconnects 54. Build-up interconnect structure 106 can comprise one or more insulating layers, comprising polyimide or other suitable dielectric material, and one or more conductive redistribution layers formed over a topside of the semiconductor die 24 and the encapsulant 62, the gate stud 43, and the source stud 45. Optionally, a final insulating layer (e.g. insulating layer 112) disposed on the top side of the package may comprise an epoxy material or solder mask with thickness greater than 20 um.

FIG. 2D shows a non-limiting example of a build-up interconnect structure 106 in which insulating layer 108 is conformally applied to, and can have a first surface that follows the contours of, encapsulant 62 and top surface 44 of studs 40. Insulation layer 108 can have a second planar surface opposite the first surface. Insulating layer 108 can contain one or more layers of photosensitive low curing temperature dielectric resist, photosensitive composite resist, polymer, liquid crystal polymer (LCP), laminate compound film, insulation paste with filler, solder mask resist film, liquid molding compound, granular molding compound, polyimide, benzocyclobutene (BCB), polybenzoxazoles (PBO), SiO2, Si3N4, SiON, Ta2O5, Al2O3, or other material having similar insulating and structural properties. Insulating layer 108 can be deposited using printing, spin coating, spray coating, lamination, or other suitable process. Insulating layer 108 can be subsequently patterned and cured using UV exposure followed by developing, or other suitable process. A portion of insulating layer 108 can be removed by laser ablation, etching, or other suitable process to form openings that expose portions of top surface 44 of studs 40, 43, 45, and interconnects 54, according to the configuration and design of semiconductor die 24 and the final semiconductor package.

An electrically conductive layer 110 can be patterned and deposited over, and in contact with, studs 40, encapsulant 62, and insulation layer 108. Conductive layer or RDL 110 can electrically connect at least the source pads 34 and gate pads 33 on the semiconductor die 24 to one or more of the vertical interconnects 54. Conductive layer 110 can be one or more layers of Al, Cu, Sn, Ni, Au, Ag, or other suitable electrically conductive material, and can include one or more of a seed layer, adhesion layer, or barrier layer. The deposition of conductive layer 110 can use PVD, CVD, electrolytic plating, electroless plating, or other suitable process. The openings in insulation layer 108 can extend completely through the insulation layer over studs 40, 43, 45, and interconnects 54. Conductive layer 110 can operate as an RDL comprising a plurality of RDL traces that assist in extending electrical connection from the active surface 30 of the semiconductor die 24 to the backside 28 of the semiconductor die 24 and to points external to semiconductor die 24. In some instances, a portion of conductive layer 110 formed within the openings in insulating layer 108 may form vertical interconnect structures or vias that provide electrical interconnection through insulating layer 108. While a non-limiting example of a build-up interconnect structure 106 is illustrated in FIG. 2D comprising a single conductive layer or RDL 110, additional RDLs can also be formed within build-up interconnect structure 106 to provide additional flexibility for routing signals between semiconductor die 24 and points external to semiconductor die 24.

FIG. 2D further shows an insulating or passivation layer 112 is conformally applied to, and follows the contours of, insulation layer 108 and conductive layer 110. Insulating layer 112 can contain one or more layers of polyimide, an epoxy solder mask, photosensitive low curing temperature dielectric resist, photosensitive composite resist, LCP, laminate compound film, insulation paste with filler, solder mask resist film, liquid molding compound, granular molding compound, BCB, PBO, SiO2, Si3N4, SiON, Ta2O5, Al2O3, or other material having similar insulating and structural properties. Insulating layer 112 can be deposited using printing, spin coating, spray coating, lamination, or other suitable process. Insulating layer 112 can be subsequently patterned and cured using UV exposure followed by developing, or other suitable process. Insulating layer 112 can be formed without any openings for connections at the top of the FMSP-PD 140 or over the active surface 30 of semiconductor die 24, the connections from within the FMSP-PD 140 to outside the package occurring at the bottom or the package, opposite insulating layer 112.

Figure 2E:
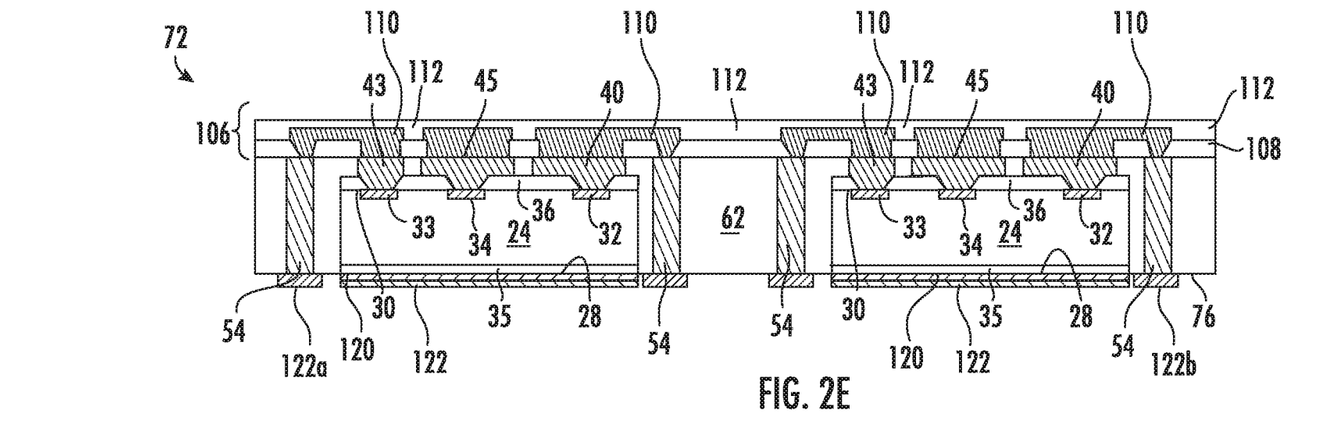

FIG. 2E shows additional layers, structures, and processing associated with the bottom side or over the back surface 76 of the embedded die panel 72, opposite the build-up interconnect structure 106. The bottom surface 76 of the reconstituted panel 72, including each of the unsingulated semiconductor die 24, may be ground and polished, thereby thinning the semiconductor die 24 to their final thickness and exposing the drain 35 at the backside 28 of the semiconductor die 24 together with a second surface of the vertical interconnect components 54.

A barrier layer 120 can be formed over the drain 35 at the backside of the semiconductor die 24 and extend beyond or past the edges or footprint of semiconductor die 24, to over a portion of the mold compound 62 around the periphery of the semiconductor die 24. The barrier layer 120 can comprise one or more layers of titanium (Ti), TiW alloy, or other suitable material, that can be formed or deposited using sputtering or other suitable process.

Optionally, a passivation layer can be formed between the barrier layer 120, the backside 28 of the semiconductor die 24 and the mold compound 62. The passivation layer may be a photo-imageable polyimide or other suitable material or any other suitable passivation or insulating layer. The passivation layer may cover the edge or periphery of the footprint of the semiconductor die 24 and an opening in the passivation layer may allow the barrier layer 120 to contact at least 80% of the area of the backside 28 or the drain 35 of the semiconductor die 24.

A land pad 122 can be formed over the barrier layer 120 and over the backside of the semiconductor die 24 so that the land pad 122 and the barrier layer 120 extend beyond or past the edges (or beyond the footprint) of the semiconductor die 24, to over a portion of the encapsulant 62 around the periphery of the semiconductor die 24. The land pad 122 can be formed, of copper or other suitable conductive materials, may comprise one or more layers, and may be formed by plating, may be applied and patterned, and may be formed by any other suitable process. The land pad 122 may cover the entire backside, or drain 35, of the semiconductor die 24, and may comprise a footprint or form factor larger (in all directions, or at least one direction) than the semiconductor die 24.

Separate land pads 122a and 122b may be formed over the encapsulant 62 in a periphery of the semiconductor die 24, and may electrically connect to at least a gate pad 33 and a source pad 34 on the active surface 30 of the semiconductor die 24 through the through mold interconnects 54, the RDL layer 110 and the Cu studs 43, 45.

Figure 2F:
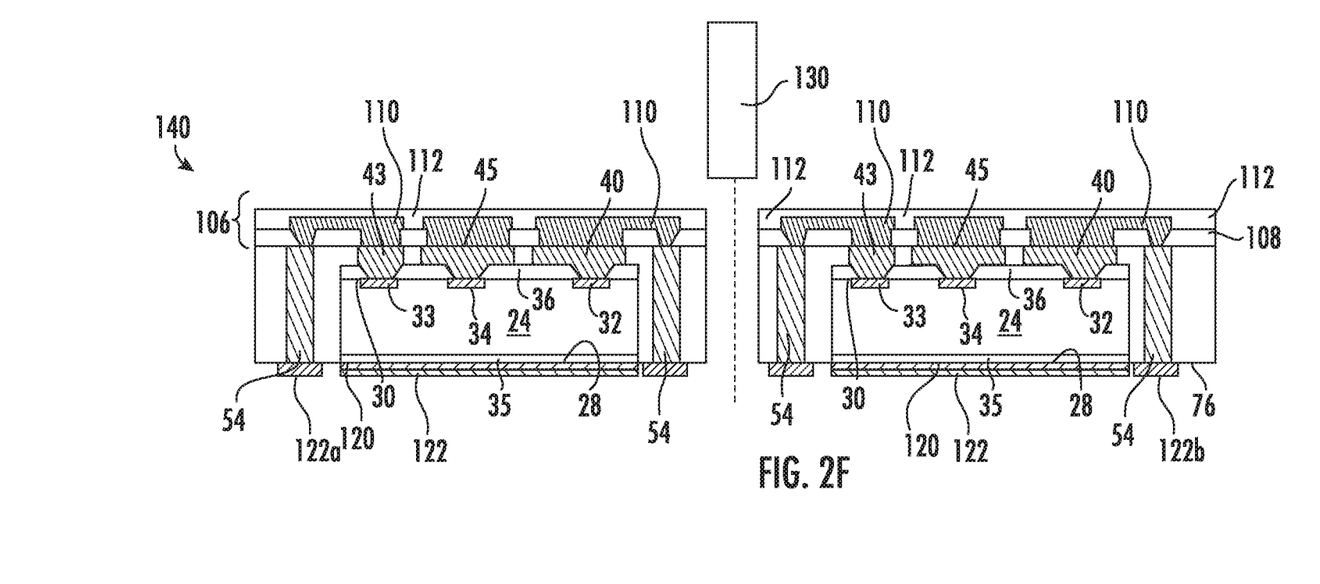

FIG. 2F shows the embedded die panel or reconstituted wafer 72 being singulated or diced through the encapsulant 62 at a portion of space or gap 60, which is offset from the through mold interconnects 54, the space 60 serving as a saw street, to create discrete semiconductor packages or embedded die packages FMSP-PD 140. The reconstituted wafer 72 can be singulated using a saw blade, laser cutting tool, or other suitable tool 130. In addition to the other advantages described herein, singulation of the FMSP-PD 140, whether by wafer sawing or other suitable process, is simplified since there is no blanket metallization applied on the back of the semiconductor wafer 20 in the wafer fabrication process (or on the reconstituted wafer 72). Therefore, the wafer saw 52, 130 does not need to cut through the blanket metallization on the backside of the wafer 20, which results in a cleaner dicing process. Die chipping and dicing blade wear during sawing is reduced since the dicing blade is not contaminated with metal from the backside of the wafer.

Figure 3A:
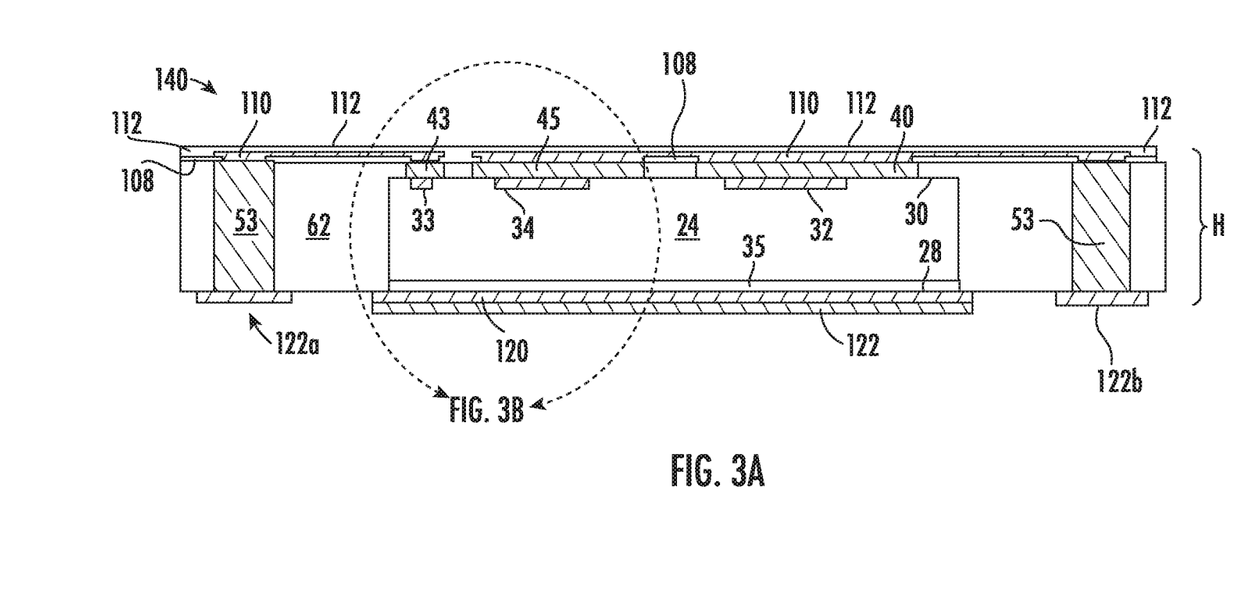
FIGS. 3A and 3B illustrate various cross-sectional side views of an embodiment of a FMSP-PD.

FIG. 3A shows an individual semiconductor package or embedded die package FMSP-PD 140 that is produced by the process illustrated in FIGS. 1A-2F. FIG. 3A shows an overall package size is also improved, with the total package height H of the FMSP-PD 140 reduced to less than 0.6 mm. The FMSP-PD 140 can also be formed with a land grid array (LGA) package format. As shown in FIG. 1, the FMSP-PD 140 can further comprise through mold interconnects 54, formed of conductive material, for providing for electrical interconnections between the source pads 34 and the gate pads 33, and the backside of the package to the land pads 122, by extending completely through the encapsulant 62 and being electrically connected to the land pads 122.

By forming the FMSP-PD 140 as described herein, the back metal or barrier layer 120 and the land pad 122 may be applied to the back-side of the semiconductor device or FMSP-PD 140 (such as power transistors) after the native semiconductor wafer 20 is singulated and the semiconductor die 24 is embedded in the encapsulant 62. As such, the backside metallization layers, barrier layer 120 and land pads 122, may be applied in the back end packaging process rather than in the front end wafer fab process (such as before the singulation of native semiconductor wafer 20). The later formed back metallization barriers 120, 122 may extend beyond the edge of the semiconductor die 24, the land pad 122 being plated over the bottom of the semiconductor die 24, extending over the edge of the semiconductor die 24, and beyond a footprint of the semiconductor die 24.

Within the FMSP-PD 140, the studs or electrically conductive layer 40, including gate studs 43 (when present) and source studs 45, may be plated over each of the gate pads 33 and the source pads 34, respectively, and within the corresponding openings 38 in the insulating layer 36 over the active surface 30 of the semiconductor die 24. The studs or electrically conductive layer 40, including source studs 45, may, and will, reduce the resistance of the connection to the source pads 34, and facilitate better current spreading and improved thermal dissipation within the FMSP-PD 140.

In contrast with conventional vertical MOSFET or IGBT die, the current design of FMSP-PD 140 allows the backside metallization layers, barrier layer 120 and land pads 122, to be applied in a back end process, at the wafer fab stage, after thinning the wafer to the final thickness while having the semiconductor die 24 further supported by encapsulant 62. The backside metallization layers, barrier layer 120 and land pads 122, make final contact in the finished package such that no additional wafer thinning may be performed after the formation of the backside metallization layers, barrier layer 120 and land pads 122. No additional thinning after the formation of the backside metallization layers, barrier layer 120 and land pads 122 is performed so as to avoid removal or damage to the backside metallization layers. However, even without thinning for FMSP-PD 140 after formation of the barrier layer 120 and land pads 122, the earlier thinning of the semiconductor die 24 need not be thinned while unsupported by encapsulant 62, as the backside metallization layers, barrier layer 120 and land pads 122, are formed in the back end wafer fab processing stage.

Applicant's FMSP-PD 140 improves upon conventional vertical MOSFET or IGBT die packaging, which also prevents thinning of the semiconductor die or semiconductor wafer after the formation of interconnect metallization layers, such as after wafer bumping or an assembly process, and therefore thins the native semiconductor wafer or the semiconductor die before the formation of the metallization layers, making handling of the thinned wafer or semiconductor die more difficult. The handling of thinned semiconductor die with conventional vertical MOSFET or IGBT die packaging results in difficulty processing the thin wafers in wafer bumping and assembly processes. The thinned wafers are more susceptible to breakage during handling of the wafers. The back metal can be damaged due to chemicals such as etchants used in some wafer bumping and assembly processes. The back metal is also susceptible to mechanical damage or contamination during wafer bump processing. This in turn can result in defects in the soldering or sinter bonding processes that are typically used to attach vertical semiconductor devices to package or module substrates. Each of the above can be avoided or minimized by adopting the methods and structures described herein with respect to FMSP-PD 140.

FMSP-PD 140 also provides improved thermal performance with respect to conventional packaging, such as for conventional vertical MOSFET or IGBT die packaging. Improved thermal performance for the FMSP-PD 140 results from the backside 28 of the semiconductor die 24 being directly connected or in thermal contact with land pad 122, which may be of a thick Cu layer or of other suitable material that is thermally conductive. By land pad 122 being thermal conducive and comprising and area larger than an area of semiconductor die 24, a robust thermal pathway is provided. Additionally, by eliminating a solder or sinter bonding die attach layer within the package 140, heat spreading is further facilitated and thermal performance of the FMSP-PD 140 is improved with respect to other conventional packages, such as conventional vertical MOSFET or IGBT die packaging.

In various embodiments, FMSP-PDs 140 may be formed as a multi-chip modules containing at least one power transistor and one power diode may be assembled using the methods described above. In other embodiments, FMSP-PDs 140 may be formed as integrated power modules such as half bridge switch circuits or full three phase switch circuits that can be formed by integrating multiple power transistors and power diodes within a single FMSP-PD 140.

Figure 3B:
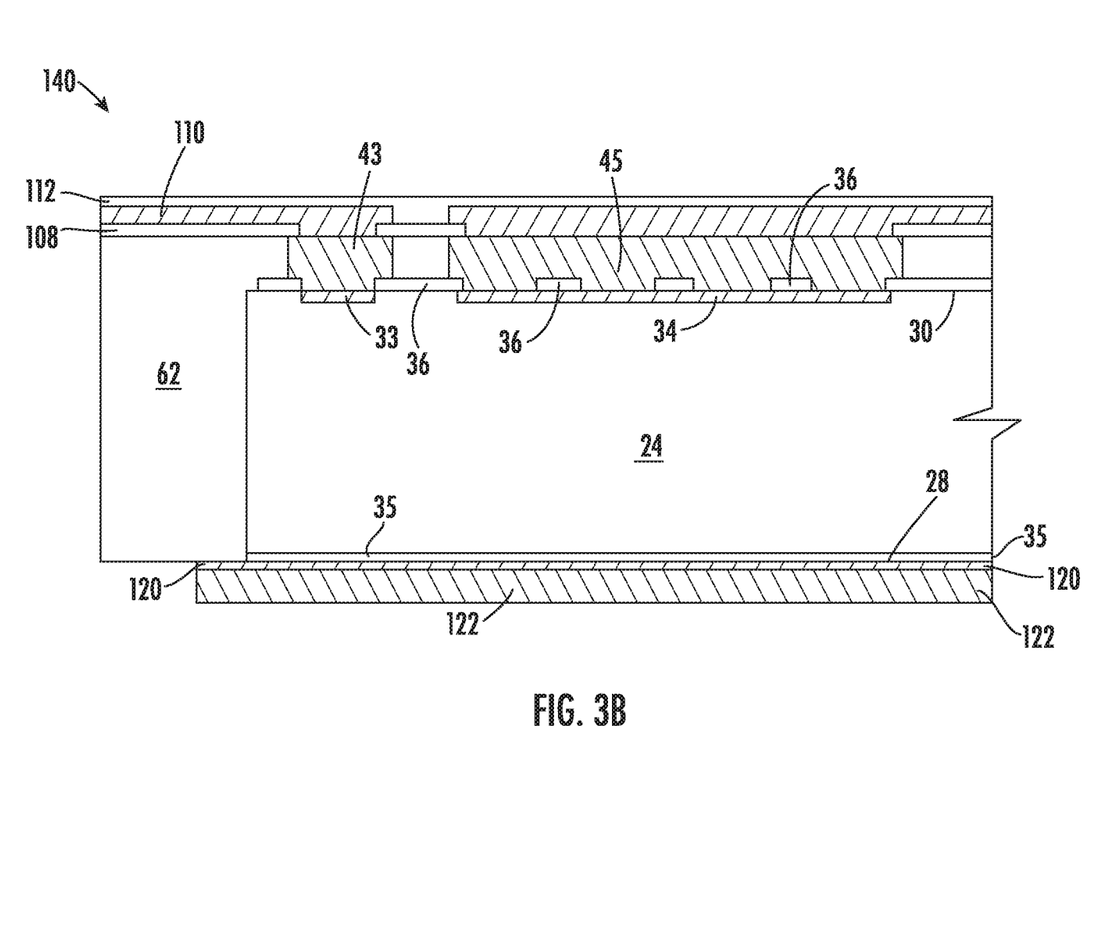

FIG. 3B shows an enlarged cross-sectional portion of FMSP-PDs 140 taken along the section line 3B-3B shown in FIG. 3A. As shown in FIG. 3B, multiple openings in insulating layer 36 may be formed over source pad 34, or any pads 32, including gate pad 33, to provide for a varied interconnect interface between the studs 40 and the pads or electrically conductive layer 32.

In the foregoing specification, various embodiments of the disclosure have been described. It will, however, be evident that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. Various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a semiconductor device, comprising:
   providing a semiconductor die comprising a front surface comprising a gate pad and a source pad, the semiconductor die further comprising a back surface opposite the front surface, the back surface comprising a drain;
   forming a gate stud over and coupled to the gate pad;
   forming a source stud over and coupled to the source pad;
   forming a single encapsulant over the semiconductor die, the single encapsulant comprising a first surface over the front surface of the semiconductor die and a second surface opposite the first surface, wherein the single encapsulant is formed after forming the gate stud and the source stud, the single encapsulant contacting a side surface of the gate stud and contacting a side surface of the source stud;
   forming a through mold interconnect after forming the single encapsulant, the through mold interconnect extending through the single encapsulant from the first surface of the single encapsulant to the second surface of the single encapsulant;

forming an RDL after forming the gate stud, the source stud, and the through mold interconnect, the RDL coupled to the gate stud, the source stud, and to the through mold interconnect;
forming a land pad over the back surface of the semiconductor die and coupled to the drain after singulating the semiconductor die from its native wafer and after forming the single encapsulant over the semiconductor die; and
singulating the semiconductor device through the single encapsulant and offset from the through mold interconnects.

2. The method of claim 1, further comprising forming the land pad with an area greater than an area of the semiconductor die.

3. The method of claim 1, further comprising forming the source stud with an area greater than or equal to 50% of an area of the semiconductor die.

4. The method of claim 1, further comprising:
forming the drain extending beyond a footprint of the semiconductor die, a barrier layer contacting 80% or more of the back surface of the semiconductor die; and
forming the land pad over the barrier layer after forming the barrier layer.

5. The method of claim 1, further comprising forming the land pad extending beyond a footprint of the semiconductor die.

6. The method of claim 1, further comprising:
forming the gate stud over and coupled to the gate pad before singulating the semiconductor die from its native wafer; and
forming the source stud over and coupled to the source pad before singulating the semiconductor die from its native wafer.

7. A method of making a semiconductor device, comprising:
providing a semiconductor die comprising a front surface comprising a source pad, the semiconductor die further comprising a back surface opposite the front surface, the back surface comprising a drain;
forming a source stud over and coupled to the source pad;
forming a single encapsulant over the semiconductor die and comprising a first surface over the front surface of the semiconductor die and a second surface opposite the first surface wherein the single encapsulant is formed after forming the source stud, the single encapsulant contacting a side surface of the source stud;
forming a through mold interconnect that extends through the single encapsulant and between the first surface of the single encapsulant and the second surface of the single encapsulant;
forming an RDL after forming the source stud and the through mold interconnect, the RDL coupled to the source stud and to the through mold interconnect; and
forming a land pad over the back surface of the semiconductor die and coupled to the drain after singulating the semiconductor die from its native wafer and after forming the single encapsulant over the semiconductor die, the land pad extending beyond a footprint of the semiconductor die and over the single encapsulant.

8. The method of claim 7, further comprising forming the land pad with an area greater than an area of the semiconductor die.

9. The method of claim 7, further comprising forming the single encapsulant around the semiconductor die and contacting a side surface of a gate stud and contacting a side surface of the source stud.

10. The method of claim 7, further comprising forming the source stud with an area greater than or equal to 50% of an area of the semiconductor die.

11. The method of claim 7, further comprising:
forming the drain extending beyond a footprint of the semiconductor die, a barrier layer contacting 80% or more of the back surface of the semiconductor die; and
forming the land pad over the barrier layer after forming the barrier layer.

12. The method of claim 7, further comprising forming the land pad extending beyond a footprint of the semiconductor die.

13. The method of claim 7, further comprising:
forming a gate stud over and coupled to a gate pad before singulating the semiconductor die from its native wafer; and
forming the source stud over and coupled to the source pad before singulating the semiconductor die from its native wafer.

14. A method of making a semiconductor device, comprising:
providing a semiconductor die comprising a front surface comprising a source stud, the semiconductor die further comprising a back surface opposite the front surface, the back surface comprising a drain;
forming a single encapsulant over the semiconductor die, the single encapsulant comprising a first surface disposed over the front surface of the semiconductor die and a second surface of the single encapsulant opposite the first surface of the single encapsulant, wherein the single encapsulant is formed after forming the source stud;
forming a through mold interconnect that extends between the first surface of the single encapsulant and the second surface of the single encapsulant;
forming an RDL after forming the source stud and the through mold interconnect, the RDL coupled to the source stud and to the through mold interconnect;
forming a land pad over the back surface of the semiconductor die and coupled to the drain after singulating the semiconductor die from its native wafer and after forming the single encapsulant over the semiconductor die, the land pad extending beyond a footprint of the semiconductor die and over the single encapsulant; and
singulating the semiconductor device through the single encapsulant.

15. The method of claim 14, further comprising forming the land pad extending beyond a footprint of the semiconductor die.

16. The method of claim 14, further comprising:
forming a source stud over and coupled to the source pad; and
forming the single encapsulant around the semiconductor die and contacting a side surface of the source stud.

17. The method of claim 16, further comprising forming the source stud with an area greater than or equal to 50% of an area of the semiconductor die.

18. The method of claim 14, further comprising:
forming the drain and extending beyond a footprint of the semiconductor die, a barrier layer contacting 80% or more of the back surface of the semiconductor die; and
forming the land pad over the barrier layer after forming the barrier layer.

19. The method of claim 14, further comprising:
forming a gate stud over and coupled to a gate pad before singulating the semiconductor die from its native wafer; and forming the source stud over and coupled to a source pad before singulating the semiconductor die from its native wafer.

\* \* \* \* \*

UNITED STATES PATENT AND TRADEMARK OFFICE
CERTIFICATE OF CORRECTION

| | | |
|---|---|---|
| PATENT NO. | : 10,818,635 B2 | Page 1 of 1 |
| APPLICATION NO. | : 16/390950 | |
| DATED | : October 27, 2020 | |
| INVENTOR(S) | : Timothy L. Olson and Christopher M. Scanlan | |

It is certified that error appears in the above-identified patent and that said Letters Patent is hereby corrected as shown below:

Column 17 Line 45 Claim 7 delete "surface wherein" and insert -- surface, wherein --

Signed and Sealed this
Nineteenth Day of January, 2021

Andrei Iancu
*Director of the United States Patent and Trademark Office*